United States Patent
Tsuruda et al.

(10) Patent No.: US 6,791,896 B2
(45) Date of Patent: Sep. 14, 2004

(54) SEMICONDUCTOR MEMORY DEVICE CAPABLE OF CHANGING AN ADDRESS SPACE THEREOF

(75) Inventors: Tamaki Tsuruda, Hyogo (JP); Yoshio Fudeyasu, Hyogo (JP); Kozo Ishida, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 168 days.

(21) Appl. No.: 10/000,397

(22) Filed: Dec. 4, 2001

(65) Prior Publication Data

US 2002/0114205 A1 Aug. 22, 2002

(30) Foreign Application Priority Data

Feb. 21, 2001 (JP) ........................................ 2001-044670

(51) Int. Cl.⁷ ................................................. G11C 8/00
(52) U.S. Cl. ........................... 365/230.01; 365/230.06; 365/189.05
(58) Field of Search .................... 365/230.01, 230.03, 365/230.06, 189.05

(56) References Cited

U.S. PATENT DOCUMENTS

| 5,355,348 A | | 10/1994 | Ooishi |
| 6,272,056 B1 | * | 8/2001 | Ooishi .................... 365/200 |
| RE37,539 E | * | 2/2002 | Oguchi et al. ............. 257/686 |
| 6,484,231 B1 | * | 11/2002 | Kim ........................ 711/105 |

FOREIGN PATENT DOCUMENTS

JP           2-185795       7/1990

* cited by examiner

*Primary Examiner*—Richard Elms
*Assistant Examiner*—Nam Nguyen
(74) *Attorney, Agent, or Firm*—McDermott Will & Emery

(57) ABSTRACT

The state of a prescribed internal column address signal bit is selectively fixed according to a mode switch circuit. A specific row address signal bit is transmitted instead of a column address signal bit under the control of the mode switch circuit. Thus, a semiconductor memory device having a plurality of storage capacities and address spaces is realized with a single chip structure.

10 Claims, 12 Drawing Sheets

F I G. 2

| ADDRESS MODE | CONFIGURATION | ADDRESS | | | MODE SELECTION | |
|---|---|---|---|---|---|---|
| | | BANK | ROW | COLUMN | AMS0 | AAMS1 |
| MODE_A | 16Mb (4Mb x 4) | BA0, BA1 | RA0-11 | CA0-7 | VSS | VSS |
| MODE_B | 32Mb (8Mb x 4) | BA0, BA1 | RA0-11 | CA0-8 | VCC | VSS |
| MODE_C | 64Mb (16Mb x 4) | BA0, BA1 | RA0-11 | CA0-9 | VSS | VCC |
| MODE_D | 64Mb (16Mb x 4) | BA0, BA1 | RA0-12 | CA0-8 | VCC | VCC |

FIG. 13
| ADDRESS MODE | AMS0 | AMS1 | SEL<0> | SEL<1> | CA<8> | CA<9> |
|---|---|---|---|---|---|---|
| MODE_A | L | L | L | L | × | × |
| MODE_B | H | L | H | L | ○ | × |
| MODE_C | L | H | H | H | ○ | ○ |
| MODE_D | H | H | H | H | ○ | ○ |
× : NOT USED
○ : USED
FIG. 14A
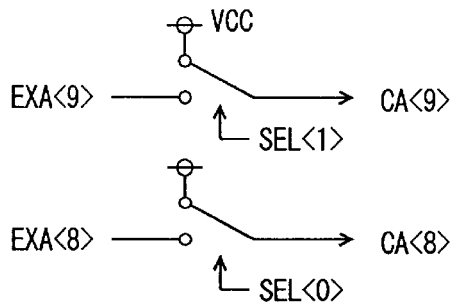
FIG. 14B
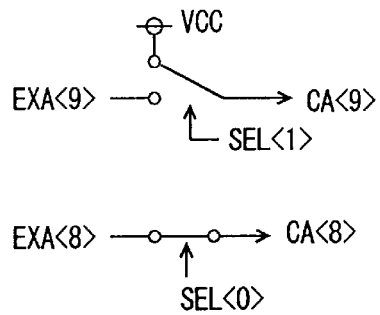
FIG. 14C
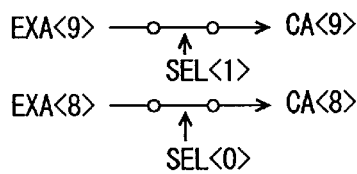
FIG. 14D
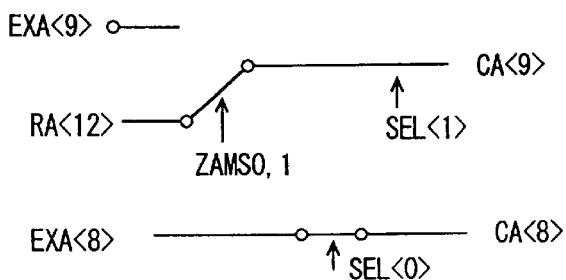

: FOUR-COLUMN PARALLEL
  ACCESS

: TWO-COLUMN PARALLEL
  ACCESS

SEMICONDUCTOR MEMORY DEVICE CAPABLE OF CHANGING AN ADDRESS SPACE THEREOF

BACKGROUND OF THE INVENTION

1. Field of the Invention

The present invention generally relates to a semiconductor memory device. More particularly, the present invention relates to a semiconductor memory device capable of internally changing the address space structure.

2. Description of the Background Art

A semiconductor memory device has been widely used because of its small size for large storage capacity, and of short access time. In such a semiconductor memory device, the size of the address space is determined by the number of bits of an address signal applied to address input pin terminals, and a storage capacity accommodating to the address space is selected according to each application. The storage capacity is determined by the size of the address space and the number of bits of word configuration.

In such a semiconductor memory device, the number of bits of the data to be processed (i.e., word configuration) is different depending on applications. Therefore, semiconductor memory devices having the same internal configuration but different word configurations such as ×1-bit, ×4-bit, and ×8-bit configurations are manufactured, and selected in terms of the word configuration according to each application.

In general, manufacturing the semiconductor memory devices of different word configurations according to different design specifications degrades the design efficiency and also increases the number of types of semiconductor memory devices, thereby complicating the product management. Therefore, the semiconductor memory devices are configured so as to accommodate to different word configurations with the same chip structure. When a common chip structure is used for a plurality of word configurations, a common internal structure is used for the plurality of word configurations. A required word configuration is implemented by fixing a potential of a specific pad using a mask interconnection or a bonding wire.

In the case of a semiconductor memory device requiring a refresh operation such as a DRAM (Dynamic Random Access Memory), semiconductor memory devices having different refresh cycles are manufactured with the same internal structure and the refresh cycle is determined according to a factor such as power consumption of the whole system or the like. As in the case of the word configuration, a required refresh cycle is determined by a mask interconnection or a bonding option (fixing of a pad potential by the bonding wire).

The word configuration is normally changed by degenerating an internal column address signal bit so as to increase the number of data bits. The refresh cycle is changed by, e.g., degenerating a row address signal bit, or internally exchanging a prescribed row address signal bit with a prescribed column address signal bit.

In the pad option as described above, the internal structure is the same, and the number of internal circuits (e.g., input/output circuits) to be simultaneously activated is changed according to the word configuration, thereby accommodating to a plurality of different specifications (e.g., word configurations and refresh cycles). However, the address space to be used in these semiconductor memory devices is the entire address space corresponding to the storage capacity of the memory array thereof. For example, a 1-M bit semiconductor memory device uses a 20-bit address signal in the case of the configuration of 1 M words ×1 bit, but uses an 18-bit address signal in the case of the configuration of 256 K words ×4 bits. In the case where a memory system of 1 M words ×4 bits is to be configured with these semiconductor memory devices, four semiconductor memory devices of which type are used is determined according to the applied system conditions such as current consumption and system size.

However, the minimum address space has been inherently determined by the storage capacity and word configuration of a single semiconductor memory device. For example, in the case of using a semiconductor memory device of 256 Kbits ×4 bits, the number of addresses of the memory system is at least $2^{18}$. In a small-scale processing system, a semiconductor memory device having an address space suitable for the application is employed so as not to unnecessarily increase the address space of the memory system. This necessitates manufacturing of many kinds of semiconductor memory devices having the same word configuration but different address space sizes. However, designing such semiconductor memory devices according to the respective specifications degrades the design efficiency, and also requires management of many kinds of products, resulting in complicated product management, as in the case of the word configurations and refresh cycles described above.

Moreover, in the case where the number of kinds of address space sizes of the semiconductor memory devices is increased, the number of address signal bits is also various for accommodating to a different address space size. Therefore, a test program must be prepared for each type of semiconductor memory device, resulting in increased costs of the semiconductor memory devices.

In this case, it may be possible to externally fix the voltage on an address signal input pin terminal so as to fix the address space to be used. However, in the case of the DRAM, row and column address signals are applied to common pin terminals in a time division multiplexed manner. Therefore, it is impossible to fix the voltage on a specific address signal input pin terminal upon assembling into a system. Moreover, depending on the size of the address space to be used, it may not be possible to maintain compatibility with another type of semiconductor memory device having a different configuration of the row and column address signal bits.

Especially, in recent years, a plurality of semiconductor memory devices are packaged in a single module to increase the number of data bits, in order to improve the data transfer rate. In such a memory module, the number of semiconductor memory devices to be packaged is fixed by the module package. From the standpoint of the number of kinds of products, the commonization of address space size is a more significant issue to be considered than conversion of the word configuration.

SUMMARY OF THE INVENTION

It is an object of the present invention to provide a semiconductor memory device capable of coping with a plurality of address space sizes.

It is another object of the present invention to provide a semiconductor memory device capable of easily implementing a memory module having address spaces of different sizes.

A semiconductor memory device according to the present invention includes: a memory array having an address space of a prescribed size; and an address setting circuit for changing the size of the address space according to an address mode designation signal while maintaining a word configuration of the address space.

According to the present invention, the size of the address space is changed according to the address mode designation signal using the address setting circuit in the semiconductor memory device. Thus, semiconductor memory devices implementing a plurality of types of address spaces can be provided with a semiconductor memory device having a single internal structure. By packaging this semiconductor memory device into a module, a memory module having a plurality of types of address spaces can be implemented with a single type of semiconductor memory devices.

Converting a specific row address signal bit into an internal column address signal bit makes it possible to easily cope even with the case where external row and column address configurations are different depending on the address space size.

When this semiconductor memory device and a plurality of other types of semiconductor memory devices are packaged in a single module, the size of the address space of the semiconductor memory device of the invention is changed according to the address mode designation signal, to accommodate the number of bits of the address signal to that of other semiconductor memory device. Thus, the memory capacity can be easily increased while maintaining the word configuration of the module. The number of transfer data bits of the module can be easily increased by changing the word configuration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a chart showing the address mode configurations implemented by the present invention.

FIG. 13 is a chart showing the state of internal column address signal bits in each address mode.

FIGS. 14A to 14D are diagrams schematically showing the correspondence between internal column address signal bits and external address signal bits in each address mode.

DESCRIPTION OF THE PREFERRED EMBODIMENTS

First Embodiment

Figure 1:
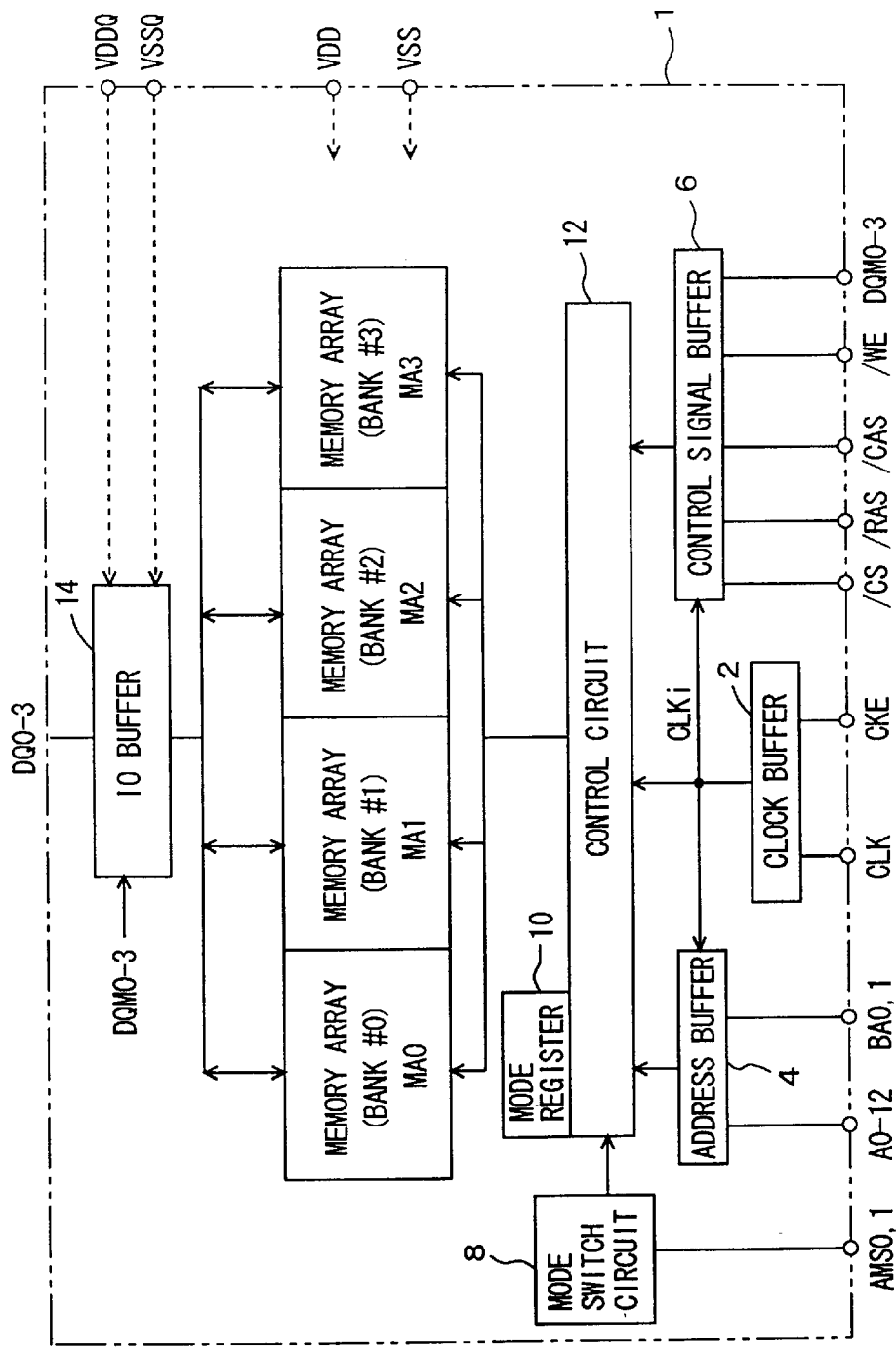
FIG. 1 is a diagram schematically showing the entire structure of a semiconductor memory device according to the present invention.

FIG. 1 is a diagram schematically showing an example of the overall structure of a semiconductor memory device according to the present invention. The semiconductor memory device of FIG. 1 is a clock synchronous semiconductor memory device that operates in synchronization with a clock signal CLK and is capable of realizing at maximum a 64-M bit storage capacity. The semiconductor memory device of FIG. 1 has a memory space of 16 M bits ×4 bits, and a 4-bit word configuration as a default.

In FIG. 1, the semiconductor memory device 1 includes: a clock buffer 2 for producing an internal clock signal CLKi according to an external clock signal CLK upon activation of an external clock enable signal CKE; a control signal buffer 6 for taking in external control signals /CS, /RAS, /CAS, /WE and DQM0 to DQM3 (DQM0-3) and producing an internal control signal in synchronization with the internal clock signal CLKi from the clock buffer 2; and an address buffer 4 for taking in external address signal bits A0 to A12 (A0–12) and external bank address signal bits BA0 and BA1 and producing internal address signal bits in synchronization with the internal clock signal CLKi.

A chip select signal /CS applied to the control signal buffer 6 indicates that this semiconductor memory device 1 is selected. When this chip select signal /CS is active (L level), it is determined that a valid command is applied to the semiconductor memory device 1. Thus, the semiconductor memory device 1 performs an internal operation designated by this command. A row address strobe signal /RAS, a column address strobe signal /CAS and a write enable signal /WE form a command, and designate an operation mode according to their logic levels at the rise of the internal clock signal CLKi. The signal DQM0-3 is a data mask signal of a ×4-bit configuration, which masks input/output of the data on a bit-by-bit basis. The command is applied in combination of the respective logic levels of the control signals /RAS, /CAS and /WE at, e.g., a rising edge of the clock signal.

The semiconductor memory device 1 further includes: memory arrays MA0 to MA3 provided respectively corresponding to banks #0 to #3; a mode switch circuit 8 for switching an address mode according to external address mode selection signals AMS0 and AMS1; a mode register 10 for storing the data designating the operation mode of the semiconductor memory device 1; a control circuit 12 for modifying the internal address signal from the address buffer 4 according to an address mode designation signal from the mode switch circuit 8 to apply the modified signal to the memory arrays MA0 to MA3, and producing an internal control signal required for the designated operation according to the internal control signal (or internal command) from the control signal buffer 6; and an input/output (IO) buffer 14 for transmitting the data between the memory arrays MA0 to MA3 and the outside of the memory device.

The address space and the address configuration are changed with the mode switch circuit 8. The mode register 10 stores the data such as column latency or burst length of the semiconductor memory device 1.

The data mask signal DQM0-3 is applied to the IO buffer 14 to mask the input/output of a designated data bit out of 4-bit data DQ0 to DQ3. An output power supply voltage VDDQ and an output ground voltage VSSQ are applied to an output buffer circuit included in the IO buffer 14. The output circuit is required to drive a large load at a high speed, and it is required to prevent a power supply bump in operation of the output buffer circuit from adversely affecting the internal circuit operation. To this end, external power supply voltages VDD and VSS are applied dedicatedly to the output buffer circuits in the semiconductor memory device 1. The power supply voltage VDD and the output power supply voltage VDDQ may have different power supply voltage levels (the output power supply voltage VDDQ may be at a higher voltage level than the power supply voltage VDD).

The basic storage capacity of the semiconductor memory device 1 shown in FIG. 1 is 64 M bits, and the 4-bit data DQ0 to DQ3 is input to and output from the semiconductor memory device 1. Therefore, the semiconductor memory device 1 has a ×4-bit word configuration. The address space of the semiconductor memory device 1 is changed according to the address mode selection signals AMS0 and AMS1 as well as the address configuration is changed without changing the ×4-bit word configuration.

The memory arrays MA0 to MA3 each includes memory cells arranged in a matrix of rows and columns, and circuitry for selecting a memory cell row and a memory cell column. The memory arrays MA0 to MA3 respectively are used as the banks #0 to #3, and have a memory cell row able to be driven to the selected state independently of each other. The banks #0 to #3 are designated by the bank address signal bits BA0 and BA1.

FIG. 2 is a table showing the correspondence between the address modes implemented according to the invention and the address signal bits to be used in the address modes. As shown in FIG. 2, the address mode is designated by combination of the respective voltage levels (logic levels) of the external address mode selection signals AMS0 to AMS1. Four address modes MODE_A, MODE_B, MODE_C and MODE_D are prepared. The bank address signal bits BA0 and BA1 are used in every address mode.

The address mode MODE_A is designated by setting both address mode selection signals AMS0 and AMS1 to the ground voltage VSS. Row address signal bits RA0 to RA1 and column address signal bits CA0 to CA7 are used in the address mode MODE_A. Since the four-bank structure is employed in every address mode, the bank address signal bits BA0 and BA1 are set to a valid state in every mode.

In this structure, $2^{20}$ addresses are allocated to each bank, where "^" indicates the power. Since 4-bit data is input to and output from each bank, the semiconductor memory device 1 has a storage capacity of $4·4·^20=16$ M bits in this address mode MODE_A.

The address mode MODE_B is designated by setting the address mode selection signals AMS0 and AMS1 to the power supply voltage VCC and the ground voltage VSS, respectively. Twelve row address signal bits RA0 to RA11 and nine column address signal bits CA0 to CA8 are used in this address mode MODE_B. The bank address signal bits BA0 and BA1 are both set to the valid state. In this case, the 21-bit address signal is used, and the word configuration is four bits. Therefore, a storage capacity of $4·2^21=8$ M bits is allocated to each bank. This semiconductor memory device 1 has a storage capacity of 32 M bits (=8 M bits ×4) in the address mode MODE_B.

The address mode MODE_C is designated by setting the address mode selection signals AMS0 and AMS1 to the ground voltage VSS and the power supply voltage VCC, respectively. Twelve row address signal bits RA0 to RA11 and ten column address signal bits CA0 to CA9 are used in this address mode MODE_C. The bank address signal bits BA0 and BA1 are also used. In this case, each bank has a storage capacity of $4·2^22=16$ M bits, and this semiconductor memory device 1 has a total storage capacity of 64 M bits. The size of the address space corresponds to 16 M addresses, and the word configuration is a 4-bit configuration.

The address mode MODE_D is designated by setting both address mode selection signals AMS0 and AMS1 to the power supply voltage VCC. Row address signal bits RA0 to RA12 and column address signal bits CA0 to CA8 are used in this address mode MODE_D. Both bank address signal bits BA0 and BA1 are used. In this case as well, the 22-bit address signal is used, and therefore each bank has a storage capacity of 4 M bits ×4 bits=16 M bits. Accordingly, the semiconductor memory device 1 has a total storage capacity of 64 M bits.

The address modes MODE_C and MODE_D implementing the same storage capacity are used in order to cope with different configurations of the address signal to be applied to the semiconductor memory device 1. More specifically, the row address signal bits RA0 to RA11 are used in the address mode MODE_C, whereas the row address signal bits RA0 to RA12 are used in the address mode MODE_D. The DRAM receives row and column addresses in a time division multiplexed manner. Therefore, allocation of the address signal bits is different depending on the types of the semiconductor memory devices, i.e., depending on the internal array structures thereof. Therefore, the address modes MODE_C and MODE_D implementing the same storage capacity and the same word configuration are provided in order to cope with a plurality of types of address signal configurations.

Figure 3A:
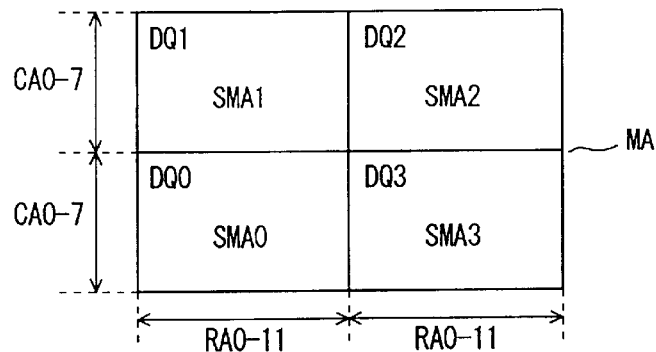
FIGS. 3A to 3C are diagrams schematically showing the structure of a memory space in a single bank of the semiconductor memory device according to the present invention.

FIG. 3A is a diagram conceptually showing an example of the memory space of the semiconductor memory device according to the present invention. FIG. 3A shows the memory space of a memory array MA of a single bank. In FIG. 3A, the memory array MA is divided into four sub memory arrays SMA0 to SMA3. The sub memory arrays SMA0 to SMA3 are provided corresponding to the data bits DQ0 to DQ3, respectively. The row address signal bits RA0 to RA11 are allocated in common to the sub memory arrays SMA0 to SMA3. Accordingly, each of the sub memory arrays SMA0 to SMA3 includes memory cells arranged in 4·K rows. In FIG. 3A, the row address signal bits RA0 to RA11 (RA0–11) are applied in common to the sub memory arrays SMA0 and SMA1. The row address signal bits RA0–11 are also applied in common to the sub memory arrays SMA2 and SMA3. Upon row selection, the memory cells on a single row are selected in each of the sub memory arrays SMA0 to SMA3.

In each of the sub memory arrays SMA0 to SMA3, column selection is performed according to the column address signal bits CA0 to CA7 (CA0–7). Thus, four columns are simultaneously selected in each sub memory array SMA0 to SMA3, as described later. Accordingly, each of the sub memory arrays SMA0 to SAM3 includes memory cells arranged in 256·4=1·K columns, and therefore has a total storage capacity of 4·K·1·K=1 M bits. Finally, a column (IO) is selected in each sub memory array according to the column address signal bits CA<9:8>, whereby a 1-bit memory cell is selected.

Figure 3B:
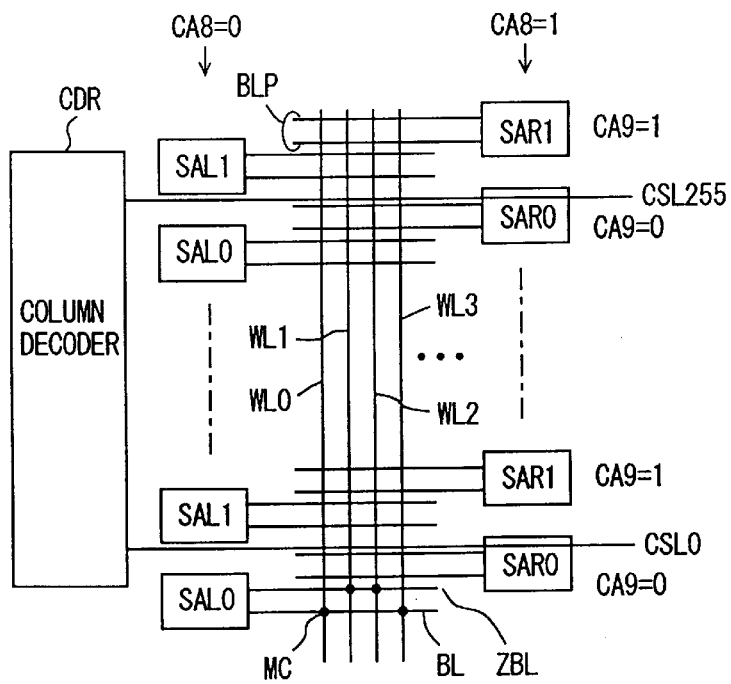

FIG. 3B is a diagram schematically showing an example of the structure of the sub memory array of FIG. 3A. The sub memory array SMA is divided into a plurality of row blocks. FIG. 3B shows the structure of a portion related to a single row block. The row block includes memory cells MC arranged in a matrix of rows and columns, word lines WL arranged corresponding to the respective memory cell rows, and bit line pairs BLP arranged corresponding to the respective memory cell columns. FIG. 3B exemplarily shows the word lines WL0 to WL3. Each word line WL has the memory cells MC on a corresponding row connected thereto. Each bit line pair BLP includes bit lines BL and ZBL for transferring complementary data. Each memory cell MC is provided at a crossing of either the bit line BL or ZBL of a corresponding bit line pair BLP and a corresponding word line WL.

The number of word lines WL included in each row block varies depending on the number of row blocks included in the sub memory array SMA. For example, in the case where the sub memory array SMA is divided into eight row blocks, a single row block includes memory cells arranged in 512 rows, and therefore includes 512 word lines.

Each row block includes 1,024 bit line pairs BLP, since the column address of a sub memory array is designated by 8 bits of CA0 to CA7 and four columns are selected simultaneously.

A sense amplifier band activated to sense, amplify and latch the memory cell data is provided on both sides of the row block. In this sense amplifier band, a sense amplifier circuit SA is provided for every other bit line pair. In the right sense amplifier band of FIG. 3B, sense amplifier circuits SAR0 and SAR1 are arranged corresponding to every other bit line pair. In the left sense amplifier band of FIG. 3B, sense amplifier circuits SAL0 and SAL1 are arranged corresponding to every other bit line pair. This arrangement of the sense amplifier circuits is referred to as an "alternately-arranged shared sense amplifier" structure, in which each sense amplifier circuit is shared by adjacent row blocks.

The sense amplifier bands are activated when a corresponding row block is selected. The sense amplifier bands are activated/inactivated by decoding row block specifying address bits included in the row address signal bits RA0 to RA11.

The row blocks of the sub memory array are commonly provided with a column decoder CDR for decoding the column address signal bits CA0 to CA7 to produce a column selection signal. The column decoder CDR decodes an 8-bit column address signal CA<7:0> to drive one of 256 column selection lines CSL0 to CSL255 to the selected state.

Four sense amplifier circuits SAL0, SAL1, SAR0 and SAR1 are simultaneously selected by a single column selection line, and coupled in parallel to not-shown internal data lines (IO lines), respectively. The allocation of address bits to the memory space is the same until column selection by the column decoder CDR, even if the address mode is changed.

One of the four sense amplifier circuits is selected according to the column address signal bits CA8 and CA9. As described later, the column address signal bit CA8 designates the right or left sense amplifier band, and the column address signal bit CA9 designates an even or odd sense amplifier circuit.

Figure 3C:
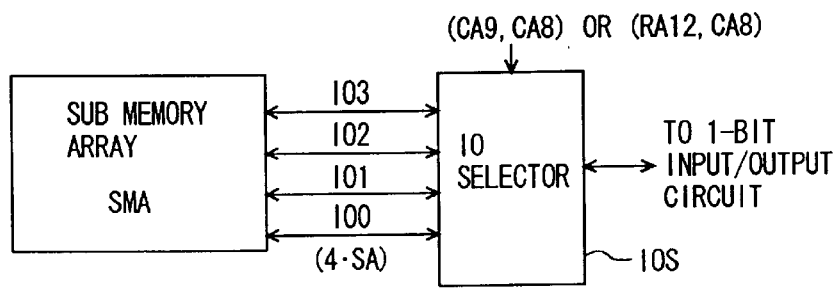

FIG. 3C is a diagram schematically showing an example of the structure of a portion for finally selecting one bit from the internal 4-bit data. The 4-bit data selected by the column decoder is transmitted from sub memory array SMA to internal data lines IO0 to IO3 (in the data read operation). These internal data lines IO0 to IO3 are respectively coupled to the sense amplifier circuits SAL0, SAL1, SAR0 and SAR1. An IO selector IOS is provided for selecting one of the internal data lines IO0 to IO3 according to the column address signal bits CA8 and CA9. This IO selector IOS performs final column selection, i.e., selection of an internal data line, whereby a 1-bit memory cell is selected from a single sub memory array.

When the column address signal bit CA8 is "1", the sense amplifier circuits SAR0 and SAR1 of the right sense amplifier band are selected. When the column address signal bit CA8 is "0", the sense amplifier circuits SAL0 and SAL1 of the left sense amplifier band are selected.

When the column address signal bit CA9 is "1", the sense amplifier circuits SAL1 and SAR1 are selected. When the column address signal bit CA9 is "0", the sense amplifier circuits SAR0 and SAL0 are selected.

More specifically, the column address signal bit CA8 designates one sense amplifier band, and the column address signal bit CA9 designates even or odd sense amplifier circuits. Thus, a single sense amplifier circuit, i.e., a single internal data line IO is selected by the column address signal bits CA8 and CA9. The respective states of the column address signal bits CA8 and CA9 applied to the IO selector IOS are set according to the address mode. Accordingly, in the address mode MODE_D, the row address signal bit RA12 is used instead of the column address signal bit CA9.

The IO selector IOS may actually be a selection circuit, or may include preamplifier circuits and write drivers for reading and writing the internal data and an IO decoder for producing a decode signal for activating a preamplifier circuit or write driver provided for each internal data line (pair) IO. The preamplifiers or the write drivers are activated to transfer the internal data according to an IO selection signal from the IO decoder and a main preamplifier enable signal or a main write driver enable signal.

In the address mode MODE_C, a single column is specified by the two column address signal bits CA9 and CA8 in each sub memory array SMA0 to SMA3. In the address mode MODE_D, a column is specified by the address signal bits RA12 and CA8 in each sub memory array. Herein, address allocation in the address mode MODE_C will be described by way of example. Two sense amplifier circuits SAR1 and SAL1 or sense amplifier circuits SAL0 and SAR0 are designated by the column address signal bit CA9. One of the two sense amplifier bands is selected by the column address signal bit CA8.

In each of the sub memory arrays SMA0 to SMA3, an internal column is designated by the column address signal bits CA0 to CA7. Thus, 4-bit memory cells are simultaneously designated by the column address signal bits CA0 to CA7. Each of the sub memory arrays SMA0 to SMA3 includes memory cells arranged in 1K columns, and has 256 column addresses. Accordingly, each of the sub memory arrays SMA0 to SMA3 has a storage capacity of 4 M bits, and the memory array MA has a total storage capacity of 16 M bits. Thus, 4-bit memory cells are simultaneously selected according to the columns designated by the column address signal bits CA0 to CA9, whereby 4-bit data is input/output.

Since this memory array MA is provided corresponding to each bank #0 to #3, the semiconductor memory device has a total storage capacity of 64 M bits. The region of a sub memory array to be used is changed according to the address mode.

The reason why the row address signal bit RA12 is used instead of the column address signal bit CA9 in FIG. 3C is that the external row address signal bit RA12 is internally changed to the column address signal bit CA9 in the address mode MODE_D. Depending on the address mode, the column address signal bits CA9 and CA8 are changed according to the external column address signal bits, or the logic levels of the column address signal bits CA9 and CA8 are fixed regardless of the logic levels of the external column address signal bits. Thus, the region of a sub memory array to be used is set according to the address mode. It is also possible to cope with a change in the external address configuration by internally changing the row address signal bit RA12 to the column address signal bit CA9.

Figure 4:
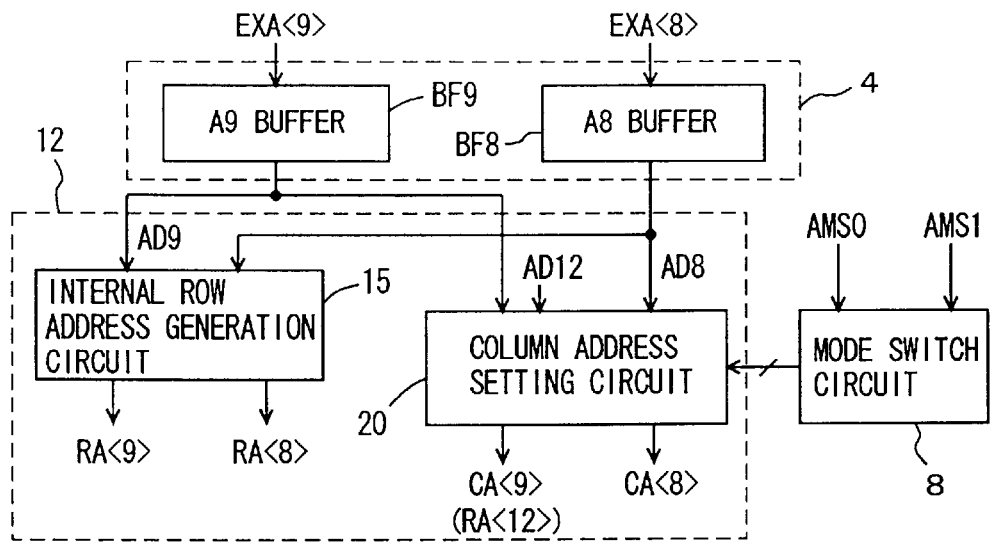
FIG. 4 is a diagram schematically showing the structure of a main part of the semiconductor memory device according to the present invention.

FIG. 4 is a diagram schematically showing the structure of a main part of the address buffer 4 and the control circuit 12 of FIG. 1. In FIG. 4, the address buffer 4 includes an A9 buffer BF9 for buffering an external address signal bit EXA<9> to produce an internal address signal bit AD9, and an A8 buffer BF8 for buffering an external address signal bit EXA<8> to produce an internal address signal bit AD8. These buffers BF9 and BF8 are common to the row address signal bits and the column address signal bits.

The control circuit 12 includes an internal row address generation circuit 15 for receiving the internal address signal bits AD9 and AD8 to produce internal row address signal bits RA<9> and RA<8>, and a column address setting circuit 20 for receiving the internal address signal bits AD9, AD8 and AD12 and changing the received address signal according to an address mode designation signal from the mode switch circuit 8 to produce internal column address signal bits CA9<9> and CA<8>.

When the address mode designation signal from the mode switch circuit 8 designates the address mode MODE_A, the column address setting circuit 20 fixes both internal column address signal bits CA<8> and CA<9> to H level. Therefore, the sense amplifier circuit SAR1 is always selected in FIG. 3B, and a quarter of the total columns are used in the sub memory array SMA. The storage capacity of the accessible memory space in the sub memory array is thus 1 M bits, and the total storage capacity of the bank is 1M·4 bits because the bank includes four sub memory arrays.

In the address mode MODE_B, the column address setting circuit 20 fixes the internal column address signal bit CA<9> to H level, and produces the internal column address signal bit CA<8> according to the address signal bit AD8.

Accordingly, in FIG. 3B, one of the two sense amplifier circuits SAR1 and SAL1 is selected according to the column address signal bit CA8, and the sense amplifier circuits SAR0 and SAL0 are not selected. Therefore, half of the total columns are used in the sub memory array SMA. The storage capacity of the accessible memory space in the sub memory array SMA is thus 2 M bits, and the total storage capacity of the bank is 2M·4 bits.

In the address mode MODE_C, the column address setting circuit 20 produces the internal column address signal bits CA<9> and CA<8> according to the internal address signal bits AD9 and AD8. In this case, all the sense amplifier circuits SAR0, SAR1, SAL0 and SAL1 are used. Accordingly, the storage capacity of the accessible memory space in the sub memory array SMA is 4 M bits, and the total storage capacity of the bank is 4M·4 bits.

In the address mode MODE_D, the column address setting circuit 20 outputs, as the internal column address signal bit CA<9>, the address signal bit AD12 received upon application of an array activation instruction signal (row active command ACT). Therefore, in the address mode MODE_D, the word configuration is the same as that in the address mode MODE_C, but the row address signal bit RA<12> is internally changed to the internal column address signal bit CA<9>. Although the bits CA8 and CA9 respectively indicate the same signals as the bits CA<8> and CA<9>, the bits CA<8> and CA<9> are used in the description of the circuit operation.

Figure 5:
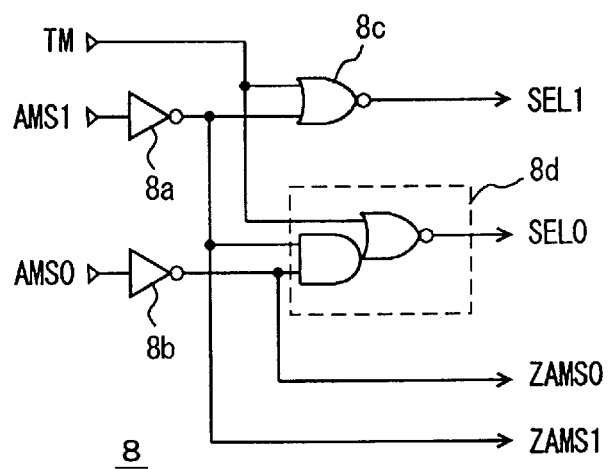
FIG. 5 is a diagram showing an example of the structure of a mode switch circuit of FIG. 4.

FIG. 5 is a diagram showing an example of the structure of the mode switch circuit 8 of FIG. 4. In FIG. 5, the mode switch circuit 8 includes an inverter 8a for receiving the external address mode selection signal AMS1, an inverter 8b for receiving the external address mode selection signal AMS0, a NOR circuit 8c for receiving a test mode designation signal TM and an output signal of the inverter 8a to produce an address setting signal SEL1, and a composite gate circuit 8d for receiving the test mode designation signal TM and the respective output signals of the inverters 8a and 8b to produce an address setting signal SEL0. This composite gate circuit 8d is equivalent to a circuit including an AND circuit for receiving the respective outputs of the inverters 8a and 8b, and a NOR gate for receiving an output signal of the AND circuit and the test mode designation signal TM to produce the address setting signal SEL0.

The inverters 8a and 8b respectively produce conversion control signal ZAMS1 and ZAMS0 for using the row address signal bit RA<12> as the column address signal bit CA<9>. According to the signals from the mode switch circuit 8, the column address setting circuit 20 controls the mode for generating the column address signal bits CA<9> and CA<8>.

When the test mode designation signal TM is set to H level, the mode switch circuit 8 of FIG. 5 forcibly sets both address setting signals SEL0 and SEL1 to L level. In this state, both internal column address signal bits CA<9> and CA<8> are forcibly set to H level as described later, and the test is performed in the address mode MODE_A. Thus, the reliability of the minimum required operation region is assured. Alternatively, both address setting signals SEL0 and SEL1 may be forcibly set to H level upon activation of the test mode designation signal TM so that every bit of the semiconductor memory device can be tested. This is achieved by replacing the NOR gate with a NAND gate for receiving an inverted signal of the test mode designation signal TM.

Figure 6:
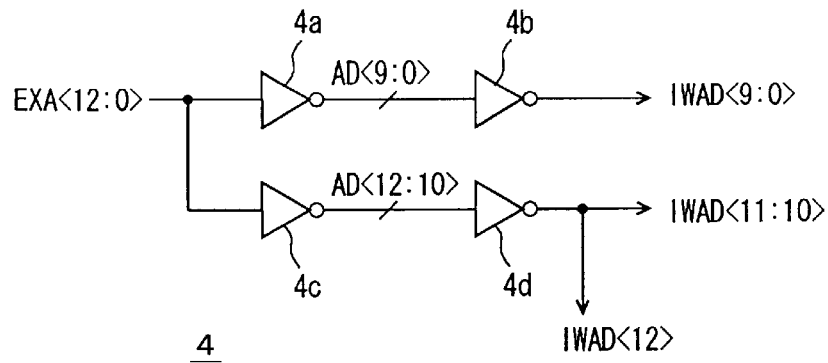
FIG. 6 is a diagram schematically showing the structure of an address buffer of FIG. 1.

FIG. 6 is a diagram schematically showing the structure of the address buffer 4 of FIG. 1. This address buffer 4 is provided for an external 13-bit address signal EXA<12:0>. The address buffer 4 includes an inverter circuit 4a for inverting the lower 10 bits of the external address signal bits EXA<12:0> into address signal bits AD<9:0>, an inverter circuit 4b for inverting the address signal bits AD<9:0> from the inverter circuit 4a into internal address signal bits IWAD<9:0>, an inverter circuit 4c for inverting the upper 3 bits <12:10> of the external address signal bits EXA<12:0> into address signal bits AD<12:10>, and an inverter circuit 4d for inverting the address signal bits AD<12:10> from the inverter circuit 4c into address signal bits IWAD<12> and IWAD<11:10>. The inverter circuits 4a to 4d each includes inverters provided for the respective address signal bits. Accordingly, the A9 buffer BF9 and the A8 buffer BF8 of FIG. 4 are included in the inverter circuits 4a and 4b.

The address buffer 4 of FIG. 6 merely produces the internal address signal bits IWAD<12:0> from the external address signal bits EXA<12:0>. In this case, the address buffer 4 may be configured to receive the internal clock signal CLKi and take in and latch the external address signal bits EXA<12:0> at a rising edge, for example, of the clock signal CLKi.

Figure 7:
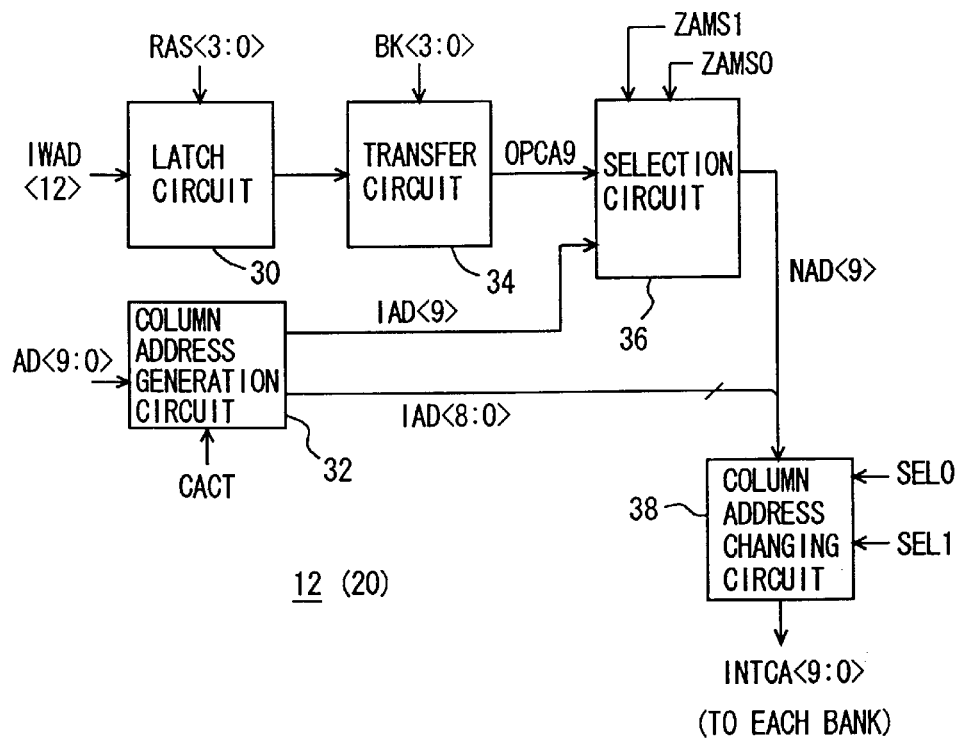
FIG. 7 is a diagram schematically showing the structure of a column address signal generating portion of a control circuit of FIG. 1.

FIG. 7 is a diagram showing the structure of a portion of the control circuit 12 of FIG. 1, which is relate to the column address signal bits. The structure of FIG. 7 corresponds to the column address setting circuit 20 of FIG. 4. FIG. 7 shows the structure corresponding to every internal column address signal bit INTCA<9:0>.

In FIG. 7, the control circuit 12 includes a latch circuit 30 for latching the internal address signal bit IWAD<12>, a transfer circuit 34 for transferring the latched bit in the latch circuit 30, a column address generation circuit 32 for generating an internal column address signal IAD<9:0>, a selection circuit 36 for selecting one of the address signal OPCA9 from the transfer circuit 34 and the internal address bit IAD<9> from the column address generation circuit 32, and a column address changing circuit 38 for generating the internal column address signal INTAC<9:0>.

The latch circuit 30 includes latches provided corresponding respectively to the banks #0 to #3, and latches the external address signal bit IWAD<12> upon activation of a latch instruction signal RAS<3:0> of 4 bits that is selectively activated in response to activation of a bank array activation signal.

The transfer circuit 34 includes transfer gates provided corresponding respectively to the latches of the latch circuit 30, and transfers the latched signals of the corresponding latches in the latch circuit 30 according to a bank designation signal BK<3:0>.

The column address generation circuit 32 takes in the address signal bits AD<9:0> from the inverter circuit 4a upon activation of a column access instruction signal (command) CACT to produce column address signal bits IAD<9:0>.

The selection circuit 36 selects either the bit OPCA9 transferred from the transfer circuit 34 or the column address signal bit IAD<9> from the column address generation circuit 32 to produce a column address signal bit NAD<9>, according to the address conversion control signals ZAMS1 and ZAMS0.

The column address changing circuit 38 receives the column address signal bits IAD<8:0> from the column address generation circuit 32 and the address signal bit NAD<9> from the selection circuit 36, and sets the address signal bits <9:8> to prescribed states to produce internal column address signal INTCA<9:0>, according to the address setting signals SEL0 and SEL1.

The internal column address signal INTCA<9:0> from the column address changing circuit 38 is transmitted in common to the banks #0 to #3. The selected bank latches this internal column address signal to perform column selection. In the latch circuit 30, the address signal bit IWAD<12> for a selected bank is latched in a corresponding latch. The latch instruction signal RAS<3:0> is selectively activated for a prescribed period in response to application of a row active command for activating a bank. When a bank is to be activated, a row address signal is applied simultaneously with the row active command. Therefore, the row address signal bit RA<12> for the selected bank is latched in the latch circuit 30.

When the bank designation signal BK<3:0> is selectively activated, the transfer circuit 34 transfers the latched data in the latch corresponding to the selected bank of the latch circuit 30. Thus, the transfer circuit 34 transmits the row address signal bit RA<12> as the bit OPCA9 for the bank where the row access and column access are sequentially performed. The selection circuit 36 selects either the address signal bit IAD<9> from the column address generation circuit 32 or the bit OPCA9 from the transfer circuit 34 in accordance with the address mode selection signals ZAMS0, and ZAMS1. Thus, the row address signal bit RA<12> can be internally changed to the column address signal bit CA<9> in the address mode MODE_D.

The column address changing circuit 38 sets the respective voltage levels of the column address signal bits CA<9:8> according to the address setting signals SEL0 and SEL1. Thus, according to the external address mode selection signals AMS1 and AMS0, the state of the internal column address signal bits CA<9:8> can be set corresponding to the address mode.

Figure 8:
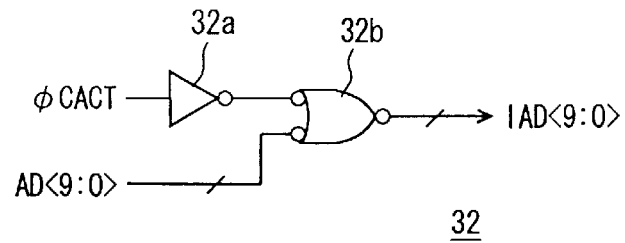
FIG. 8 is a diagram showing an example of the structure of a column address generation circuit of FIG. 7.

FIG. 8 is a diagram showing the structure of the column address generation circuit 32 of FIG. 7. In FIG. 8, the column address generation circuit 32 includes an inverter circuit 32a for receiving a column address activation signal φCACT, and a gate circuit 32b responsive to L level of an output signal of the inverter circuit 32a, for passing therethrough the address signal bits AD<9:0> from the inverter circuit 4a of FIG. 6 as a column address signal to produce column address signal bits IAD<9:0>. The column address activation signal φCACT is activated for a prescribed period in response to activation of the column access instruction signal (column access command) CACT. The gate circuit 32b includes logic gates provided corresponding respectively to the address signal bits AD<9:0>, and passing therethrough a corresponding bit when the output signal of the inverter circuit 32a is at L level. This gate circuit 32b is equivalent to an AND circuit. The column address activation signal φCACT is activated for a prescribed period in response to application of a read command instructing a data read operation or a write command instructing a data write operation. The column address activation signal φCACT is a signal common to the banks #0 to #3.

Figure 9:
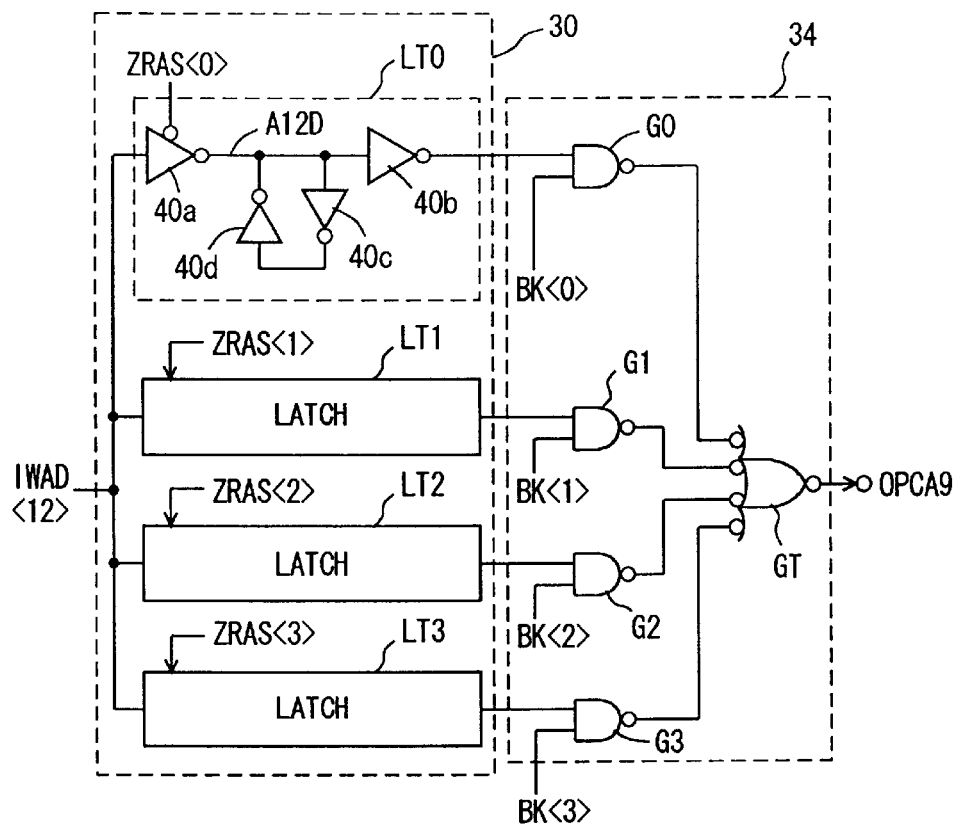
FIG. 9 is a diagram showing the structure of a latch circuit and a transfer circuit of FIG. 7.

FIG. 9 is a diagram showing the structure of the latch circuit 30 and the transfer circuit 34 of FIG. 7. In FIG. 9, the latch circuit 30 includes latches LT0 to LT3 corresponding respectively to the banks #0 to #3. Since the latches LT0 to LT3 have the same structure, an exemplary structure of the latch LT0 is representatively shown in FIG. 9. The latch LT0 includes a tri-state inverter buffer 40a enabled upon activation of the latch instruction signal ZRAS<0> for the bank #0, for transmitting the internal address signal bit IWAD<12> from the inverter circuit 4d of FIG. 6 to an internal node A12D, an inverter circuit 40b for inverting the signal at the internal node A12D, and inverters 40c and 40d forming a half latch for latching the signal at the node A12D.

The latch instruction signal ZRAS<0> is set at L level for a prescribed period in response to application of a row active command ACT for the bank #0. The tri-state inverter buffer 40a is enabled to transmit the address bit IWAD<12> from the address buffer 4 to the internal node A12D in response to activation of the latch instruction signal ZRAS<0>. At this time, the latch instruction signals ZRAS<3:1> are at H level. Therefore, the tri-state inverter buffers at the input stages of the remaining latches LT1 to LT3 are in an output high-impedance state, and the latches LT1 to LT3 do not take in the address signal bit IWAD<12>. The address signal bit IWAD<12> taken in the latches LT0 to LT3 is applied simultaneously with a row active command for the corresponding banks. Therefore, this address signal bit IWAD<12> is a row address signal bit for a corresponding bank, i.e., a bit RA<12>.

The transfer circuit 34 includes gate circuits G0 to G3 provided corresponding respectively to the latches LT0 to LT3, and a gate circuit GT receiving the output signals of the gate circuits G0 to G3. The gate circuits G0 to G3 are enabled upon activation of the corresponding bank designation signals BK<0> to BK<3> to pass therethrough the output latch signals of the corresponding latches LT0 to LT3. The gate circuit GT produces the bit OPCA9 according to the respective output signals of the gate circuits G0 to G3.

The gate circuits G0 to C3 are each formed of, e.g., a NAND gate, and the gate circuit GT is formed of an AND gate. The bank designation signals BK<0> to BK<3> are selectively activated according to the bank address signal bits BA0 and BA1. The bank designation signals BK<3:0> are activated upon row/column access to the corresponding banks. When the bank designation signals BK<3:0> are all at L level, the output signals of the gate circuits G0 to G3 are all at H level, and the bit OPCA9 from the gate circuit GT is therefore at H level. For example, when the bank designation signal BK<0> is brought to H level, the gate circuit G0 is enabled, and the respective output signals of the remaining gate circuits G1 to G3 are at H level. Accordingly, the gate circuit GT drives the bit OPCA9 to H level or L level according to the output signal of the gate circuit G0. The gate circuit GT thus functions as a transfer gate.

Note that the transfer circuit 34 for transferring the bit OPCA9 is formed of the gate circuits G0 to G3 and GT. However, a transmission gate or a tri-state buffer circuit may be provided in each of the latches LT0 to LT3, which are selectively rendered conductive or enabled by the corresponding bank designation signals. In this case, however, a pull-up or pull-down resistance must be provided at the output node of the transfer circuit in order to prevent the bit OPCA9 from entering an electrically floating state.

Figure 10:
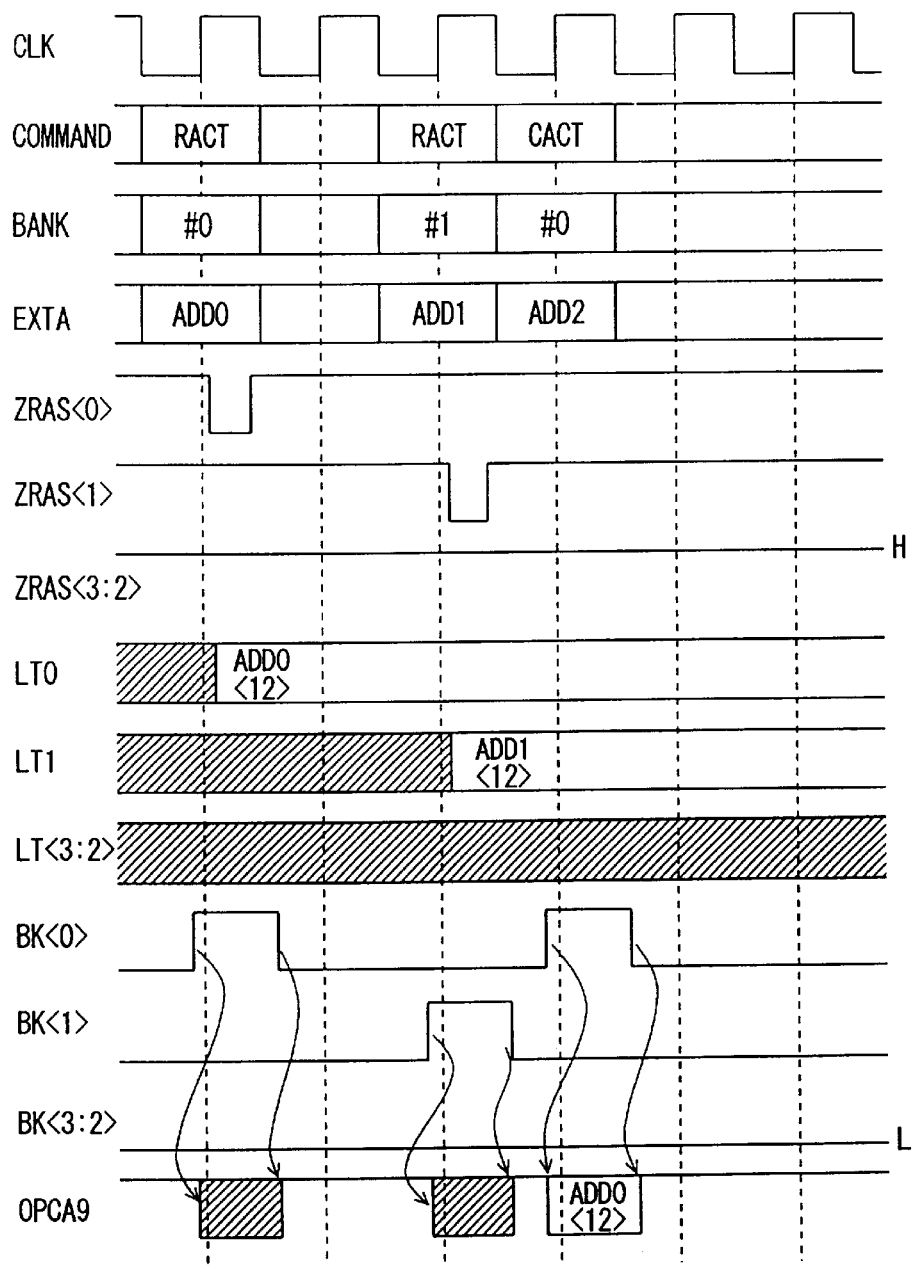
FIG. 10 is a timing chart illustrating the operation of the transfer circuit and the latch circuit of FIG. 9.

FIG. 10 is a timing chart illustrating the operation of the latch circuit 30 and the transfer circuit 34 of FIG. 9. FIG. 10 shows the signal waveforms obtained when a row active (access) command RACT instructing row access is applied to the banks #0 and #1 and subsequently a column access command (column selection activation signal) CACT is applied to the bank #0. This semiconductor memory device takes in an external control signal in synchronization with a rise of the clock signal CLK, thereby starting the internal operation.

The row active command RACT is applied to the bank #0, and the address signal ADD0 is applied as an external address signal EXTA. According to the row active command RACT, the latch instruction signal ZRAS<0> is brought at L level for a prescribed period in synchronization with a rise of the clock signal CLK. The tri-state inverter buffer 40a of the latch LT0 of FIG. 9 is responsively enabled to transfer the bit ADD0<12> of the address signal ADD0 to the internal node A12D. When the latch instruction signal ZRAS<0> rises to H level, the tri-state inverter buffer 40a enters the output high-impedance state, and the latch LT0 latches the address signal bit ADD0<12>. The latch data of the remaining latches LT1 to LT3 are indefinite since the corresponding latch instruction signals ZRAS<0:3> are all at H level.

Then, the row active command RACT is applied to the bank #1. The latch instruction signal ZRAS<1> is responsively activated at L level for a prescribed period, and the latch LT1 latches the bit ADD1<12> of the address signal ADD1.

In the following cycle, the column access command CACT is applied to the bank #0, and the address signal ADD2 is applied as an external address signal EXTA. The bank designation signal BK<0> is rendered at H level, and the gate circuit G0 of the transfer circuit 34 is responsively enabled to transfer the latch bit ADD0<12> of the latch LT. Accordingly, the bit OPCA9 corresponds to the address signal bit ADD0<12>. The address signal applied upon application of the row active command RACT is a row address signal RA for designating a row. The address signal applied upon column access is a column address signal for designating a column. Accordingly, upon this column access, the row address signal bit RA<12> is transferred as the bit OPCA9 in the selected bank. The bit OPCA9 is in turn transmitted as the a column address signal bit AD<9> through the selection circuit described below, and thus, the row address signal bit RA<12> is resultantly converted into an internal column address signal bit CA<9>. In other words, when row access to a bank is performed, a row address signal bit is latched in the corresponding latch. The latched row address bit is transferred upon subsequent column access to the same bank. Therefore, the row address signal bit RA<12> can be changed to the column address signal bit CA<9> on a bank-by-bank basis.

Note that, in the timing chart of FIG. 10, the bank designation signals BK<0> and BK<1> are driven to the active state according to the bank address signal BA and the active command RACT or CACT asynchronously with the clock signal CLK. Thus, the bank selection signal is driven to the selected state at a faster timing. The bank address signal may alternatively be decoded in synchronization with the clock signal to produce a bank designation signal.

In response to application of the row active command RACT and the column active command CACT, the bank designation signal for a selected bank out of the bank designation signals BK<3:0> is driven to the active state according to the bank address signal. However, the latched address bit is transferred upon column access. Therefore, the bank designation signals BK<3:0> may alternatively be activated only when the column access is performed. This is easily implemented by merely producing the bank designation signals BK<3:0> in response to combination of the column access command CACT and the bank address signal.

Note that the latch instruction signals ZRAS<3:0> are driven to the active state at L level for a prescribed period in response to activation of an array activation signals ACT<3:0>. The array activation signals ACT<3:0> are activated while the corresponding banks are in the selected state. The command is applied by combination of the logic levels of the control signals /CS, /RAS, /CAS and /WE of FIG. 1.

This semiconductor memory device may alternatively be a semiconductor memory device that operates in synchronization with both rising and falling edges of the clock signal CLK.

Figure 11:
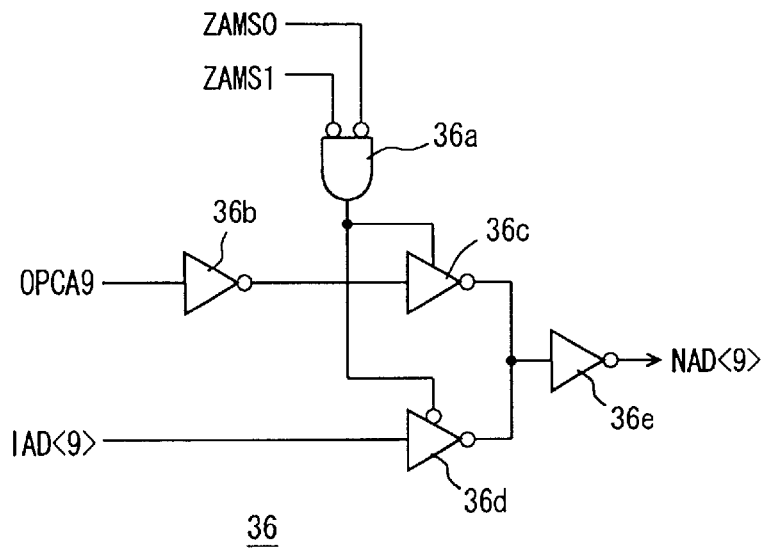
FIG. 11 is a diagram showing the structure of a selection circuit of FIG. 7.

FIG. 11 is a diagram showing an example of the structure of the selection circuit 36 of FIG. 7. In FIG. 11, the selection circuit 36 includes a NOR circuit 36a for receiving the address conversion control signals ZAMS0 and ZAMS1, an inverter 36b for receiving the output bit OPCA9 of the transfer circuit 34 of FIG. 9, a tri-state inverter buffer 36c enabled when the output signal of the NOR circuit 36a is at H level, for inverting the output signal of the inverter 36b, a tri-state inverter buffer 36d enabled when the output signal of the NOR circuit 36a is at L level, for inverting the internal address bit IAD<9> from the column address generation circuit 32 (see FIG. 7), and an inverter 36e coupled to the respective outputs of the tri-state inverter buffers 36c and 36d, for inverting the output signal of the tri-state inverter buffer 36c or 36d to produce a column address signal bit NAD<9>.

In the selection circuit 36 of FIG. 11, when both address conversion control signals ZAMS0 and ZAMS1 are set at L level, the output signal of the NOR circuit 36a is at H level, and the tri-state inverter buffer 36c is enabled responsively. In this state, the bit OPCA9 from the transfer circuit 34 is transmitted as a column address signal bit NAD<9>. In other words, in the address mode MODE_D in which the address conversion control signals ZAMS0 and ZAMS1 are both set at L level, the row address signal bit RA<12> is converted into a column address signal bit CA<9>.

When at least one of the address conversion control signals ZAMS0 and ZAMS1 is at H level, the output signal of the NOR circuit 36a is at L level, and the column address signal bit NAD<9> is produced according to the internal address signal bit IAD<9>.

Thus, the row address signal bit RA<12> is converted into the column address signal bit CA<9> only in the address mode MODE_D.

Figure 12:
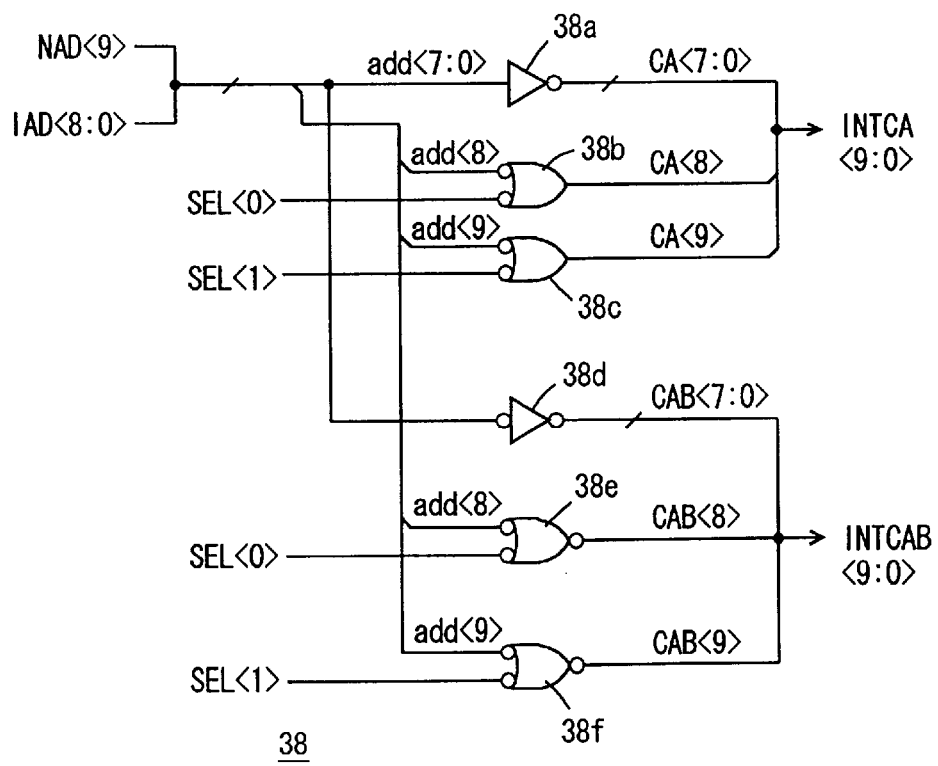
FIG. 12 is a diagram showing the structure of a column address changing circuit of FIG. 7.

FIG. 12 is a diagram schematically showing the structure of the column address changing circuit 38 of FIG. 7. In FIG. 12, the column address changing circuit 38 includes an inverter circuit 38a for inverting eight bits add<7:0> out of the column address signal bits IAD<8:0> from the column address generation circuit 32 and the bit NAD<9> from the selection circuit 36 into internal column address signal bits CA<7:0>, a NAND gate 38b for receiving the bit ADD<8> and the address setting signal SEL<0> to produce an internal column address signal bit CA<8>, and a NAND gate 38c for receiving the bit add<9> corresponding to the bit NAD<9> from the selection circuit and the address setting signal SEL<1> to produce an internal column address signal bit CA<9>. The bit add<8> corresponds to the bit IAD<8> from the column address signal generation circuit. The state of the internal column address signal bits CA<9:8> are set with the NAND gates 38b and 38c according to the address mode.

The column address changing circuit 38 further includes a buffer circuit 38d for buffering the bits add<7:0> to produce complementary internal column address signal bits CAB<7:0>, a gate circuit 38e for receiving the bit add<8> and the address setting signal SEL<0> to produce an internal column address signal bit CAB<8>, and a gate circuit 38f for receiving the bit add<9> and the address setting signal SEL<1> to produce a complementary internal column address signal bit CAB<9>. The gate circuit 38e fixes the internal column address signal bit CAB<8> to H level when the address setting signal SEL<0> is at L level, but produces a complementary internal column address signal bit CAB<8> according to the bit add<8> when the address setting signal SEL<0> is at H level.

The gate circuit 38f fixes the complementary internal column address signal bit CAB<9> to H level when the address setting signal SEL<1> is at L level, but operates as a buffer to produce a complementary internal column address signal bit CAB<9> according to the bit add<9> when the address setting signal SEL<1> is at H level.

The internal column address signal bits CA<7:0>, CA<8> and CA<9> form ten-bit internal column address signal INTCA<9:0>, and the complementary internal column address signal bits CAB<7:0>, CAB<8> and CAB<9> form complementary internal column address signal bits INTCAB<9:0>. These internal column address signal bits INTCA<9:0> and INTCAB<9:0> are applied in common to the column decode circuits in the banks. The column decode circuit of the selected bank is responsively activated to perform a decoding operation.

FIG. 13 is a table showing the correspondence between the address modes to be designated in the present embodiment, and the control signals and the column address signal bits CA<8>, CA<9>. Now, the operation of the column address changing circuit 38 of FIG. 12 will be described with reference to the table of FIG. 13.

(A) Address Mode MODE_A

As shown in FIG. 13, both address setting signals SEL<1:0> are set to L level in the address mode MODE_A. Accordingly, the column address changing circuit 38 of FIG. 12 fixes both column address signal bits CA<8> and CA<9> from the gate circuits 38b and 38c to H level. Similarly, the column address changing circuit 38 fixes both complementary column address signal bits CAB<8> and CAB<9> from the gate circuits 38e and 38f to L level. In other words, as shown in FIG. 14A, both internal column address signal bits CA<9> and CA<8> are set to H level, i.e., power supply voltage VCC level, regardless of the logic level of the external address signal bits EXA<9> and EXA<8>. The column address signal bits CA<7:0> and CAB<7:0> are produced according to the external address signal. Accordingly, in the address mode MODE_A, only the region of the sense amplifier circuit SAR1 of FIG. 3B is used, and the region of the columns corresponding to the remaining sense amplifier circuits SAR0, SAL0 and SAL1 is not used.

(B) Address Mode MODE_B

In the address mode MODE_B, the address setting signal SEL<0> is set to H level, and the address setting signal SEL<1> is set to L level. In this state, the column address changing circuit 38 of FIG. 12 fixes the internal column address signal bit CA<9> from the gate circuit 38c to H level, and fixes the complementary internal column address signal bit CAB<9> from the gate circuit 38f to L level. The NAND gate 38b operates as an inverter buffer, and produces the internal column address signal bit CA<8> according to the bit add<8>. Similarly, the AND gate 38e produces the complementary internal column address signal bit CAB<8> according to the bit add<8>.

Accordingly, in the address mode MODE_B, the internal column address signal bit CAB<9> is fixed to H level. Thus, two odd-number sense amplifier circuits SAR1 and SAL1 of FIG. 3B are used, and the remaining even-number sense amplifier circuits SAR0 and SAL0 are not used. In each sub memory array, column selection and IO selection are performed according to the column address signal bits INTCA<8:0>. In other words, as shown in FIG. 14B, in the address mode MODE_B, the internal column address signal bit CA<9> is fixed to H level regardless of the external address signal bit EXA<9>, whereas the internal column address signal bit CA<8> is produced according to the external address signal bit EXA<8>.

(C) Address Mode MODE_C

In the address mode MODE_C, both address setting signal bits SEL<0:1> are set to H level, as shown in FIG. 13. In this case, the NAND gates 38b and 38c both operate as an inverter, and produce the internal column address signal bits CA<9:8> according to the bits add<9:8>. Similarly, the AND gates 38e and 38f operate as a buffer, and produce the complementary internal column address signal bits CAB<9:8> according to the bits add<9:8>. In this case, as shown in FIG. 14C, the internal column address signal bits CA<9:8> are produced according to the external address signal bits EXA<9:8>. All the sense amplifier circuits SAR0, SAR1, SAL0 and SAL1 are used, and therefore all the column address regions are used as address space.

(D) Address Mode MODE_D

In the address mode MODE_D, as shown in FIG. 13, the address setting signals SEL<1:0> are both at H level, and the internal column address signal bits CA<9:8> are produced according to the bits add<9:8>. However, the row address signal bit RA<12> is selected by the selection circuit 36 of FIG. 11 according to the address conversion control signals ZAMS0 and ZAMS1 produced from the address mode selection signals AMS0 and AMS1, and is transmitted as the bit NAD<9>. In this case, as shown in FIG. 14D, the internal column address signal bit CA<9> is produced according to the row address signal bit RA<12> in place of the external address signal bit EXA<9>. On the other hand, the column address signal bit CA<8> is produced according to the external column address signal bit EXA<8>. Thus, in the address mode MODE_D, the row address signal bit RA<12> is changed to the column address signal bit CA<9>, and the region of the sub memory array SMA is designated using the row address signal bit RA<12>.

Modification of Column Address Changing Circuit 38

Figure 15:
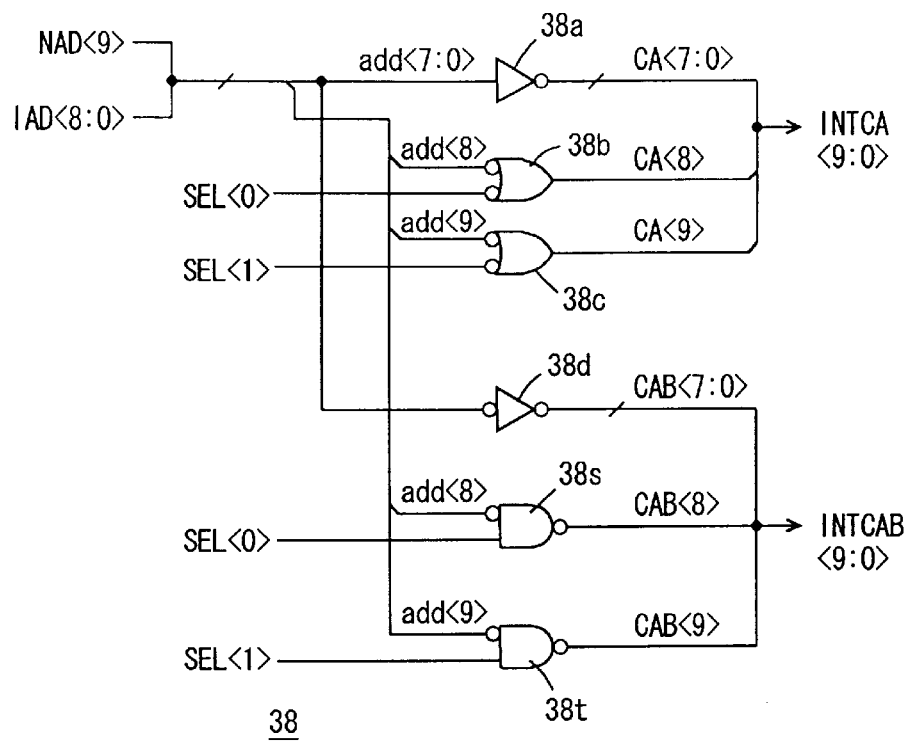
FIG. 15 is a diagram showing a modification of the column address changing circuit of FIG. 7.

FIG. 15 is a diagram showing a modification of the column address changing circuit 38 of FIG. 7. The column address changing circuit 38 of FIG. 15 is different from the column address changing circuit 38 of FIG. 12 in the point that the AND gates 38f and 38e for producing the complementary column address signal bits CAB<9:8> shown in FIG. 12 are replaced with gate circuits 38t and 38s. When the address setting signal SEL<1> is at H level, the gate circuit 38t operates as a buffer circuit and produces a complementary column address signal bit CAB<9> according to the bit add<9>. When the address setting signal SEL<1> is at L level, the gate circuit 38t fixes the complementary column address signal bit CAB<9> to H level regardless of the logic level of the bit add<9>.

When the address setting signal SEL<0> is at H level, the gate circuit 38s operates as a buffer circuit and produces a complementary column address signal bit CAB<8> according to the bit add<8>. When the address setting signal SEL<0> is at L level, the gate circuit 38s fixes the complementary column address signal bit CAB<8> to H level.

In the address mode MODE_A, the column address changing circuit of FIG. 15 fixes all the column address signal bits CA<9:8> and CAB<9:8> to H level, and the column address signal bits CA<9:8> are set to the degenerated state.

Figure 16A:
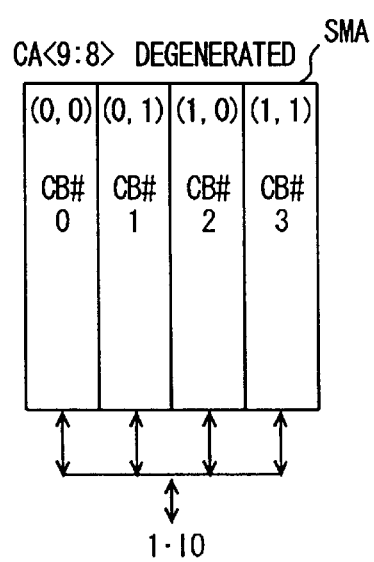
FIGS. 16A and 16B are diagrams schematically showing the structure of column blocks that are selected by the column address changing circuit of FIG. 15.

As shown in FIG. 16A, in this state, column access is made in parallel in each column block CB#0 to CB#3. FIG. 16A shows block division according to a column address of the memory cells of a single sub memory array SMA. The column blocks CB#0 to CB#3 are each designated by the column address signal bits CA<9:8>. This column block selection is performed by the IO selector IOS of FIG. 3C.

In this case, as to the internal data transmission lines coupled to an output circuit, the IO selector IOS (see FIG. 3C) reads 4-bit memory cell data onto a single internal data line. Therefore, the amplitude of the internal data line can be increased, allowing for a high-speed read operation. In the data write operation, a 1-bit internal data transmission line coupled to a data input/output circuit is coupled commonly to the write drivers provided in the respective internal data lines IO through the IO selector IOS, whereby each write driver writes the data to a corresponding memory cell through the selected sense amplifier circuit. The same data is stored in the 4-bit memory cells. Therefore, even if 1-bit data becomes defective, the defective bit can be repaired by the remaining bits.

Figure 16B:
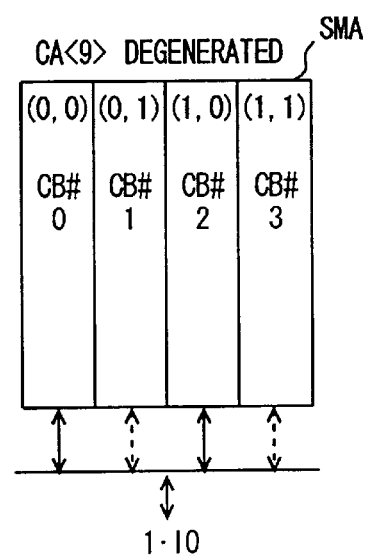

On the other hand, in the address mode MODE_B, the gate circuit 38t fixes both column address signal bits CA<9> and CAB<9> to H level. The column address signal bits CA<8> and CAB<8> are produced according to the bit add<8> as the gate circuit 38s operates as a buffer. In this state, the column address signal bit CA<9> is in the degenerated state. Therefore, in the address mode MODE_B, column access to two of the column blocks CB#0 to CB#3 is simultaneously made as shown in FIG. 16B. For example, in FIG. 16B, data access to the column blocks CB#0 and CB#2 or to the column blocks CB#1 and CB#3 is simultaneously made. Two column blocks are designated according to the column address bit CA<8>, and selected by the IO selector IOS of FIG. 3C. In this case as well, the amplitude of the internal data line can be increased in the data read operation.

When the column address changing circuit of FIG. 15 is used, the column address space is reduced, but every memory cell can be used.

Note that when the column address changing circuit 38 of FIG. 12 is used, the region of the sub memory array to be used is fixed, but a circuit for selecting a column in each sub memory array operates in every address mode.

However, the present invention is also applicable to a memory array configuration where a single sub memory array is selected among four memory sub arrays and 4-bit data access is made to the selected sub memory array. This memory array structure corresponds to the structure of, e.g., FIG. 16A, with the modification that the column blocks CB#0 to CB#3 are replaced with the sub memory arrays that are accessed on a 4-bit basis. In this case, column-related circuitry in these sub memory arrays performs a block dividing operation according to the column address signal bits CA<9:8> upon column access. The operation of a column selection circuit provided for the sub memory array that is not used in an address mode may be forcibly stopped according to the address setting signals SEL<1:0>. This enables reduction in current consumption (a charging/discharging current is reduced by inhibiting the dynamic operation).

Figure 17:
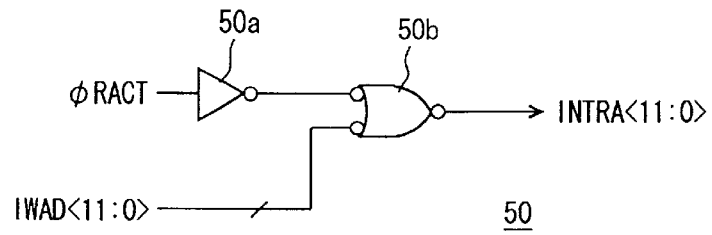
FIG. 17 is a diagram schematically showing the structure of a circuit for generating row address signal bits in the semiconductor memory device according to the present invention.

FIG. 17 is a diagram showing an example of the structure of a circuit for generating internal row address signal bits. In FIG. 17, the row address signal generation circuit 50 includes an inverter circuit 50a for receiving a row address activation signal φRACT, and an AND circuit 50b for receiving the internal address signal bits IWAD<11:0> from the inverter circuits 4b and 4d of the address buffer 4 of FIG. 6 and the output signal of the inverter circuit 50b to produce internal row address signal bits INTRA<11:0>. The row address activation signal φRACT is activated to H level for a prescribed period in response to application of a row active command RACT. Accordingly, when the row active command (row access command) RACT is applied, the AND circuit 50b is enabled to pass therethrough the internal address signal IWAD<11:0> from the address buffer 4, thereby producing the internal row address signal bits INTRA<11:0>.

Accordingly, in every address mode, the row selection operation is internally performed in the selected bank according to the 12-bit row address signal INTRA<11:0>, and the column selection operation (including the IO selection operation) is internally performed according to the 10-bit column address signal INTCA<9:0>.

Figure 18:
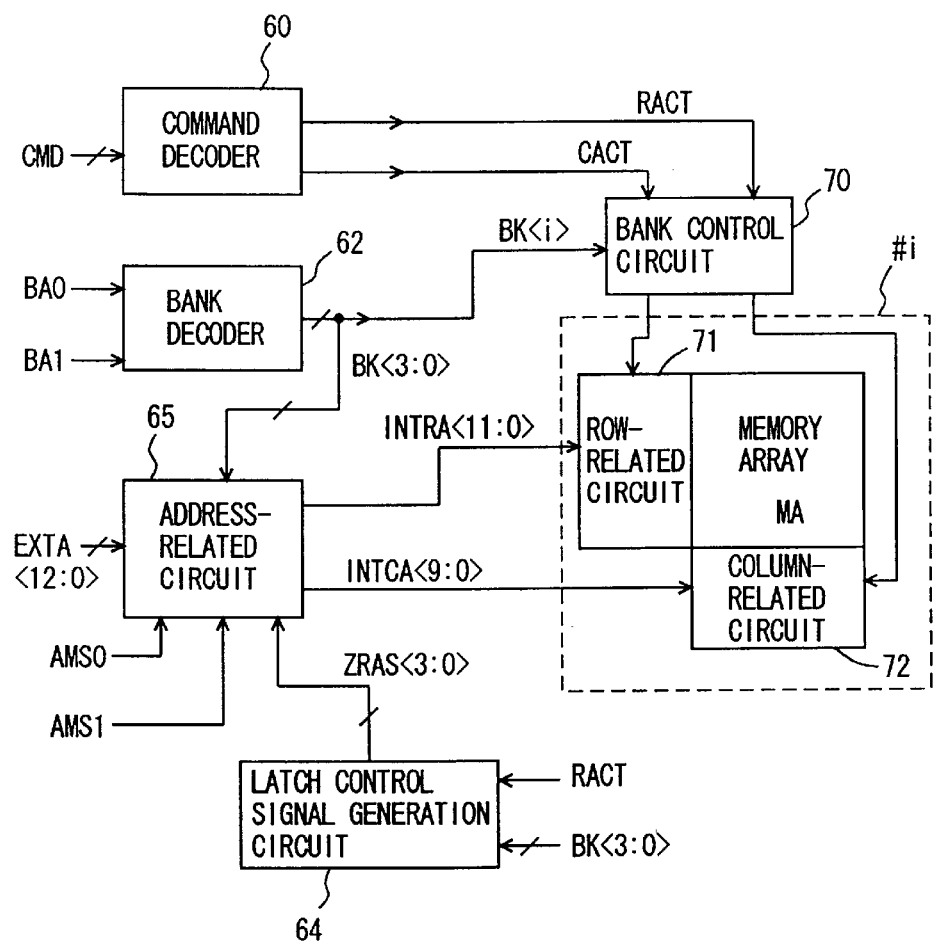
FIG. 18 is a diagram showing the overall structure of the semiconductor memory device according to the present invention in more detail.

FIG. 18 is a diagram specifically showing the overall structure of the semiconductor memory device according to the present invention. FIG. 18 shows the structure of a single bank #i. In FIG. 18, the semiconductor memory device includes, as central control circuitry, a command decoder 60 for receiving an external command designating an operation mode to generate an internal operation mode designating signal, a bank decoder 62 for decoding a bank address signal to generate a bank designating signal in accordance with the result of decoding, an address-related circuit 65 for generating an internal row and column address signal, and a latch control signal generation circuit 64 for generating a latch control signal for controlling a latching operation of the internal address signal of the address-related circuit 65.

The command decoder 60 receives an external command CMD and produces an operation mode instruction signal designated by the received command.

The bank decoder 62 produces bank designation signals BK<3:0> according to the bank address signal bits BA0 and BA1.

The address-related circuit 65 produces internal row address signal bits INTRA<11:0> and internal column address signal bits INTCA<9:0> based on the external address signal bits EXTA<12:0> according to an address generation mode defined by the address mode selection signals AMS0 and AMS1.

The latch control signal generation circuit 64 produces latch instruction signals ZRAS<3:0> according to the bank designation signals BK<3:0> and the row active command (array activation instruction signal) RACT and applies the latch instruction signals ZRAS<3:0> to the address-related circuit 65.

The command CMD applied to the command decoder 60 includes the control signals /CS, /RAS, /CAS and /WE of FIG. 1. The command decoder 60 produces an operation mode instruction signal designating an internal operation mode according to a combination of the respective logic levels of the control signals at a rising edge of the clock signal, for example. FIG. 18 exemplarily shows the following two operation mode instruction signals produced by the command decoder 60: an array activation instruction signal RACT that is activated in response to application of a row active command, and a column selection operation activation signal CACT that is activated in response to application of a column access command (read command or write command).

The address-related circuit 65 includes the address buffer 4 of FIG. 1 and a circuit portion for generating the row and column address signals. The address-related circuit 65 latches the row address signal bit RA<12> according to the latch instruction signals ZRAS<3:0> and transfers the row address signal bit RA<12> according to the bank designation signals BK<3:0>. The address-related circuit 65 also sets the mode of the internal column address signal bits INTCA<9:0> according to the address mode selection signals AMS0 and AMS1.

In response to activation of the array activation instruction signal RACT, the latch control signal generation circuit 64 drives the latch instruction signals ZRAS<3:0> to the active state according to the bank designation signals BK<3:0>.

The command decoder 60, bank decoder 62, latch control signal generation circuit 64 and address-related circuit 65 are common to a plurality of banks #0 to #3, and are therefore provided in the central circuit portion.

The bank #i includes a memory array MA having a plurality of memory cells, a row-related circuit 71 for decoding the internal row address signal bits INTRA<11:0> to select a row of memory cells in the memory array MA, and a column-related circuit 72 for selecting a column of memory cells in the memory array MA according to the address signal bits INTCA<9:0>.

A bank control circuit 70 is provided for the bank #i. The bank control circuit 70 is enabled when the bank designation signal BK<i> is active, and performs a variety of controls for implementing the operations designated by various operation mode instruction signals from the command decoder 60.

In the structure of FIG. 18, the internal row address signal bits INTRA<11:0> and the internal column address signal bits INTCA<9:0> generated by the address-related circuit 65 are common to the banks #0 to #3. However, the circuit portion for changing the internal row address signal to the internal column address signal may be provided in each bank. More specifically, for example, the circuit for latching the row address signal bit RA<12>, the transfer circuit and the column address changing circuit, which are included in the circuit for generating the column address signal bits INTCA<9:0>, may be provided in each bank, while the internal row address signal bits INTRA<11:0> may be generated and latched on a bank-by-bank basis. This structure can be easily implemented by generating the column selection operation activation signal φCACT of FIG. 8 and the array activation instruction signal φRACT of FIG. 17 on a bank-by-bank basis and generating the internal row/column address signal bits in each selected bank.

The internal column address signal bits INTCA<9:0> may be pre-decoded in common to the banks, and the column selection operation including the IO selection operation may be performed in a selected bank. The same applies to the row address signal bits INTRA<11:0>.

Figure 19:
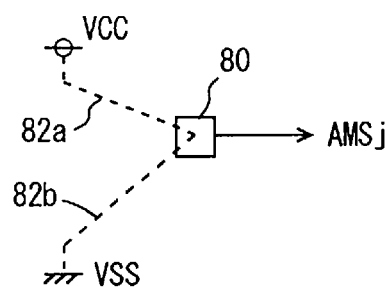
FIG. 19 is a diagram representing a method for programming an address mode selection signal according to the present invention.

FIG. 19 is a diagram schematically showing the structure of a portion for generating an address mode selection signal AMSj where j=0, 1. A corresponding terminal 80 for generating the address mode selection signal AMSj (AMS0, AMS1) is fixed to the power supply voltage VCC level or the ground voltage VSS level through an out-chip wire 82a or 82b provided external to the chip. In the case where the semiconductor memory devices are formed into flip chips and packaged in a multi-chip module, the terminal 80 corresponds to a pad. Upon assembling on the module, the pad 80 is coupled to a power supply line or ground line through the bonding wire 82a or 82b.

Figure 20:
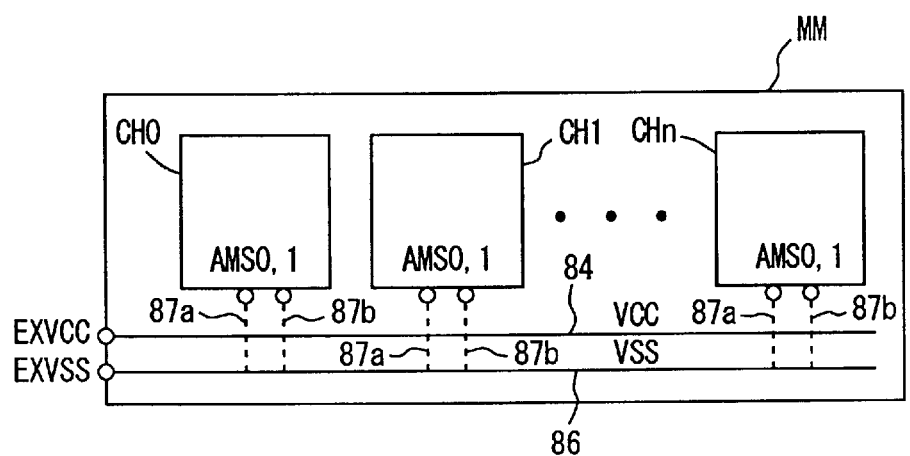
FIG. 20 is a diagram representing another method for programming an address mode selection signal according to the present invention.

On the other hand, in the case where the packaged chips (semiconductor memory devices) are assembled in a memory module MM as shown in FIG. 20, each of the chips CH0 to CHn is inserted into a socket of the memory module MM. In this case, the memory module MM includes a power supply line 84 and a ground line 86 respectively coupled to the external power supply voltage source (terminal) EXVCC and the external ground source EXVSS. When these chips are assembled in the module, out-chip wires 87a and 87b are used to selectively couple the terminals for generating the address mode selection signals to the power supply line 84 and ground line 86 extending within the module MM. Thus, the pin terminals for setting the address mode selection signals AMS0 and AMS0 are concealed from the outside. As a result, pin terminals for address-mode selection need not be provided to the memory module MM, allowing for reduction in size of the memory module MM.

Other Applications

In the foregoing description, a clock synchronous DRAM operating in synchronization with a clock signal is described as a typical semiconductor memory device. However, the present invention is applicable to any semiconductor memory device, provided that a memory cell is addressed using row and column addresses. In particular, even in the structure receiving the row and column addresses simultaneously, the row address signal bit RA<12> can be internally changed to the column address signal bit CA<9> using the same structure, whereby the same effects can be obtained.

The maximum storage capacity of the semiconductor memory device is not limited to 64 M bits, but the semiconductor memory device may have another storage capacity such as 256 M bits. The address modes to be designated are not limited to four address modes. In the case where the address configuration varies depending on the storage capacity, the number of address modes is set according to the address configuration.

As has been described above, according to the present invention, the address space to be used can be changed with external signals. Therefore, a single chip structure can be used as memory devices having a plurality of different storage capacities. This facilitates the product management as well as improves the design efficiency. Moreover, by internally changing a prescribed row address signal bit to a column address signal bit, a memory device of the same chip structure can be easily applied to the memory systems having different address configurations.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device, comprising:
   a memory array having an address space of a prescribed size; and
   address setting circuitry for changing a size of said address space according to an address mode designation signal while maintaining a word configuration of said address space.

2. The semiconductor memory device according to claim 1, wherein
   said memory array includes memory cells arranged in rows and columns, and
   said address setting circuitry includes a circuit for transmitting a specific bit of a multi-bit row address signal designating a row of memory cells in said memory array as a bit of a multi-bit column address signal designating a column memory cells of said memory array, according to said address mode designation signal.

3. The semiconductor memory device according to claim 1, wherein
   said memory array includes memory cells arranged in rows and columns, and said address setting circuitry includes a circuit for selectively setting a specific bit of a multi-bit column address signal designating a column of memory cells of said memory array to a fixed state according to said address mode designation signal.

4. The semiconductor memory device according to claim 1, wherein
   said memory array includes memory cells arranged in rows and columns, and
   said address setting circuitry includes:
   a latch circuit for latching a specific bit of a multi-bit row address signal designating a row of memory cells of said memory array, in response to a row access instruction instructing row selection in said memory array; and
   an address transmitting circuit for transmitting, upon column access for performing column selection in said memory array, the specific row address signal bit latched in said latch circuit as a bit forming a multi-bit column address signal designating a column of memory cells in said memory array, according to said address mode designation signal.

5. The semiconductor memory device according to claim 4, wherein said address transmitting circuit transmits a most significant bit of said multi-bit row address signal as a most significant bit of said multi-bit column address signal.

6. The semiconductor memory device according to claim 1, wherein
   said memory array is divided into a plurality of banks that are driven to a selected state independently of each other, each bank including a plurality of memory cells arranged in rows and columns and subjected to row access for selecting a memory cell row and column access for selecting a memory cell column in a time division multiplexed manner, and
   said address setting circuit includes:
   a plurality of latch circuits arranged corresponding to the respective banks, each for latching a specific bit of a multi-bit row address signal upon row access to a corresponding bank; and
   an address transmitting circuit arranged common to said plurality of banks, for transmitting, upon column access to a first bank of the plurality of banks, the specific row address signal bit latched in a latch circuit corresponding to said first bank as a bit forming a multi-bit column address signal for said first bank, according to said address mode designation signal.

7. The semiconductor memory device according to claim 6, wherein said address transmitting circuit transmits a most significant bit of said multi-bit row address signal as a most significant bit of said multi-bit column address signal.

8. The semiconductor memory device according to claim 1, wherein
   said memory array includes a plurality of memory cells arranged in rows and columns, and
   said address setting circuitry includes:
   a latch circuit for latching a specific row address bit upon row access for selecting a row of memory cells of said memory array;
   an address transmitting circuit for selecting, upon column access for selecting a column of memory cells of said memory array, either of said specific row address bit and a prescribed bit of an external multi-bit column address signal applied upon column access, and transmitting said either as a bit of the column address signal, according to said address mode designation signal; and a circuit for receiving, upon said column access, the bit transmitted from said address transmitting circuit and remaining bits of said multi-bit column address signal to form an internal intermediate column address signal of multi-bit, and selectively setting a specific bit of said internal intermediate column address signal to a fixed state according to said address mode designation signal.

9. The semiconductor memory device according to claim 1, wherein said address mode designation signal includes a prescribed number of control signals, and voltage levels of said prescribed number of control signals are fixed individually.

10. The semiconductor memory device according to claim 1, wherein said semiconductor memory device is assembled in a module, and a voltage level of said address mode designation signal is set upon assembling of said semiconductor memory device in said module so as to fixedly set a configuration of an internal address signal.

* * * * *